（12） United States Patent
Teeka Srinvasa Setty et al.

(10) Patent No.: US 7,821,436 B2
(45) Date of Patent: Oct. 26, 2010

(54) SYSTEM AND METHOD FOR REDUCING POWER DISSIPATION IN AN ANALOG TO DIGITAL CONVERTER

(75) Inventors: Venkatesh Teeka Srinvasa Setty, Bangalore (IN); Chandrashekar Lakshminarayanan, Thanjavur (IN); Prasun Kali Bhattacharya, Burdwan (IN); Prasenjit Bhowmik, Agartala (IN); Chakravarthy Srinivasan, Bangalore (IN); Mukesh Khatri, Indore (IN); Sanjeeb Kumar Ghosh, Chandan-Pukur (IN); Sumanth Chakkirala, Vasco-da-gama (IN); Sundararajan Krishnan, Bangalore (IN); Prakash Easwaran, Bangalore (IN)

(73) Assignee: Cosmic Circuits Private Limited, Bangalore (IN)

( * ) Notice: Subject to any disclaimer, the term of this patent is extended or adjusted under 35 U.S.C. 154(b) by 498 days.

(21) Appl. No.: 11/760,743

(22) Filed: Jun. 9, 2007

(65) Prior Publication Data
US 2009/0295609 A1 Dec. 3, 2009

(30) Foreign Application Priority Data
Jun. 9, 2006 (IN) .................. 1005/CHE/2006
Jun. 8, 2007 (IN) .................. 1182/CHE/2007

(51) Int. Cl.
*H03M 3/00* (2006.01)
(52) U.S. Cl. ..................... 341/121; 341/161
(58) Field of Classification Search ............ 341/121, 341/120, 155, 156, 161, 162, 159, 165; 330/9; 327/124
See application file for complete search history.

(56) References Cited
U.S. PATENT DOCUMENTS

| | | | |
|---|---|---|---|
| 5,220,326 A | 6/1993 | Ledzius et al. | |
| 5,387,914 A | 2/1995 | Mangelsdorf | |
| 5,764,176 A * | 6/1998 | Ginetti | 341/161 |
| 6,087,897 A * | 7/2000 | Wang | 330/9 |
| 6,535,157 B1 | 3/2003 | Garrity et al. | |
| 6,661,214 B1 | 12/2003 | Hann et al. | |
| 6,825,790 B2 | 11/2004 | Chou | |
| 6,891,493 B2 | 5/2005 | Whittaker et al. | |

(Continued)

FOREIGN PATENT DOCUMENTS
WO   WO 99/63414   12/1999

*Primary Examiner*—Rexford N Barnie
*Assistant Examiner*—Joseph Lauture
(74) *Attorney, Agent, or Firm*—Kanika Radhakrishnan; Evergreen Valley Law Group P.C.

(57) ABSTRACT

A system and method for reducing the power dissipated in an Analog to Digital Converter (ADC). The method includes the steps of: receiving a residue output from a previous phase of a plurality of clock phases where the plurality of clock phases includes a sample-and-hold phase and an amplifying phase for sampling and amplifying an analog input signal respectively, eliminating an effect of load on a residue amplifier when amplifying the residue output to generate an amplified residue output in the amplifying phase, and eliminating an effect of small feedback factor when sampling the amplified residue output in the sample-and-hold phase. Power advantage is achieved by sharing the load on the residue amplifier across the sample-and-hold phase and the amplifying phase rather than being fully present in any one of the clock phases. The present invention also provides a method for reducing the number of comparators used in ADCs.

6 Claims, 5 Drawing Sheets

U.S. PATENT DOCUMENTS

| | | |
|---|---|---|
| 6,963,300 B1 | 11/2005 | Lee |
| 7,158,443 B2 | 1/2007 | Lin |
| 7,248,199 B2 | 7/2007 | Asano et al. |
| 7,253,686 B2 | 8/2007 | Ali |
| 7,285,996 B2 | 10/2007 | Fiedler |
| 2005/0212575 A1 | 9/2005 | Kim |
| 2007/0030753 A1 | 2/2007 | Kwak |
| 2007/0046345 A1 | 3/2007 | Tai et al. |
| 2008/0054963 A1 | 3/2008 | Masenas |

* cited by examiner

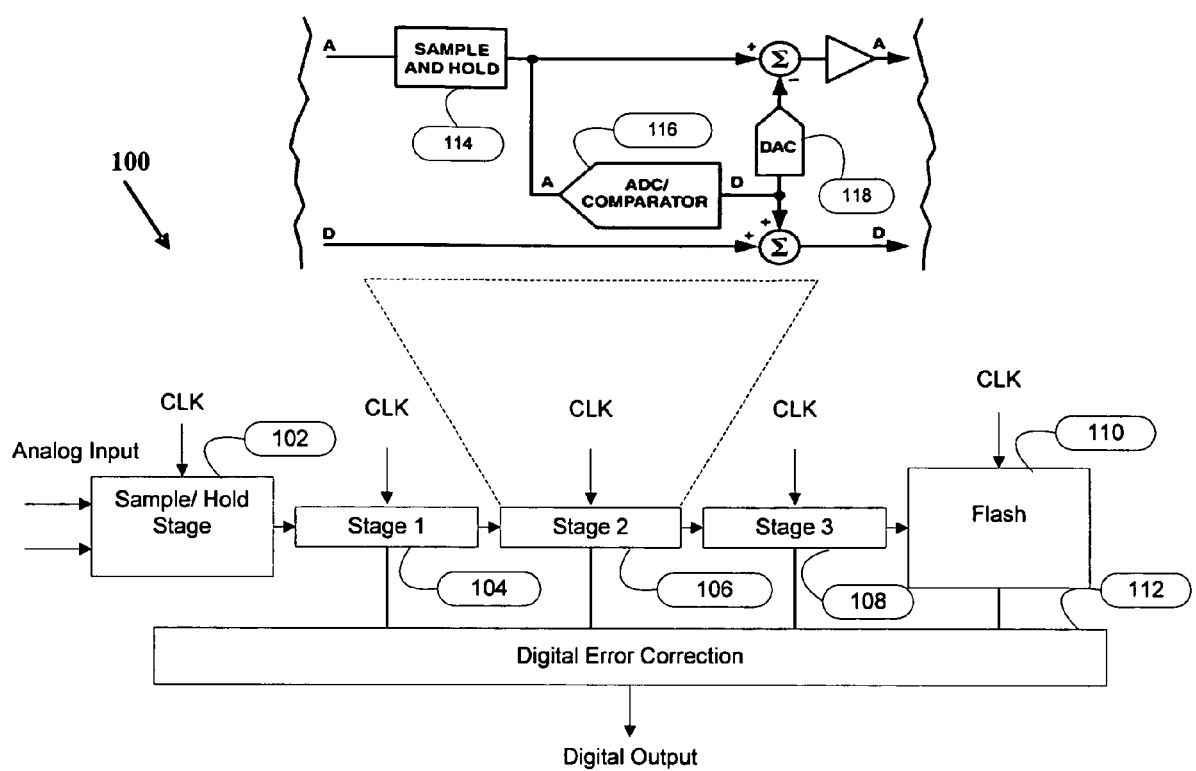
FIG: 1 (Prior Art Figure)

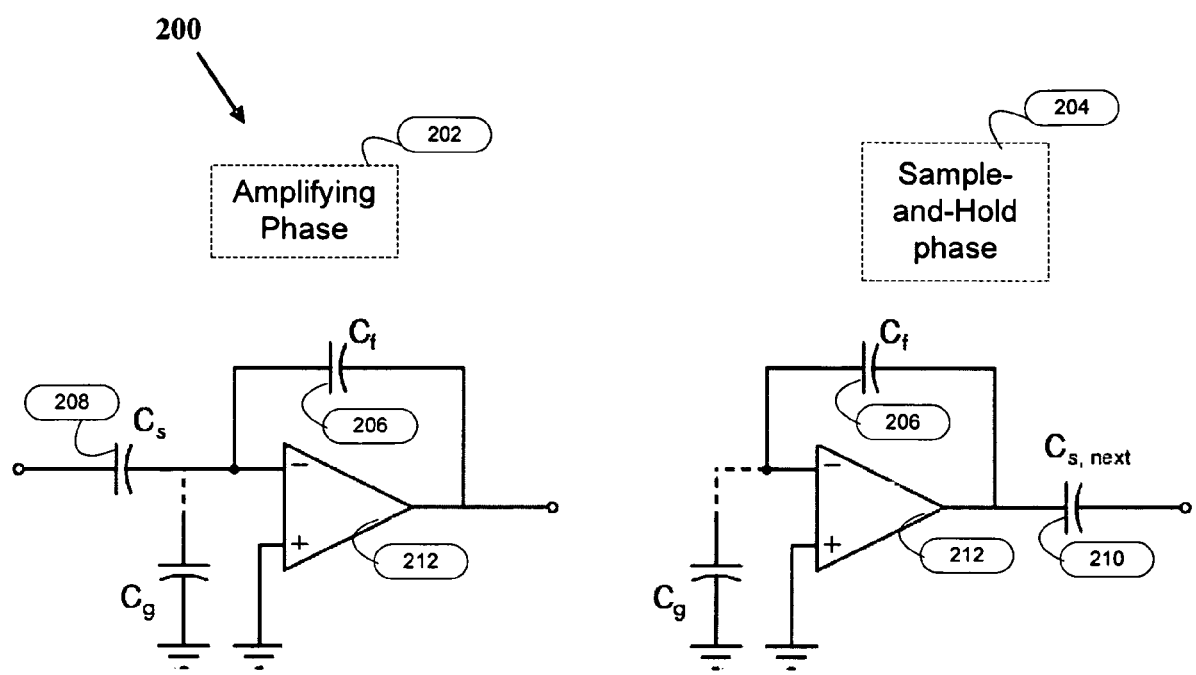
FIG: 2

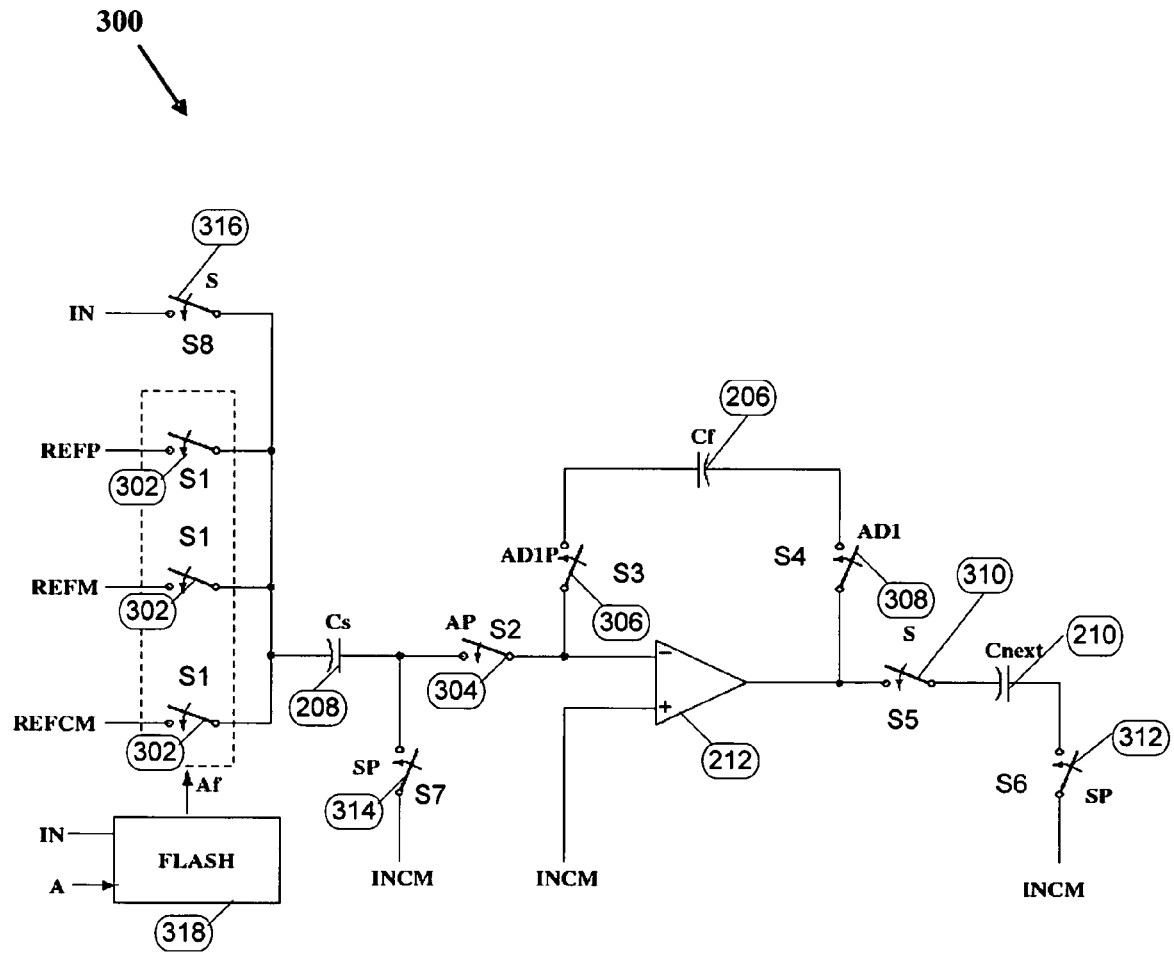
FIG: 3

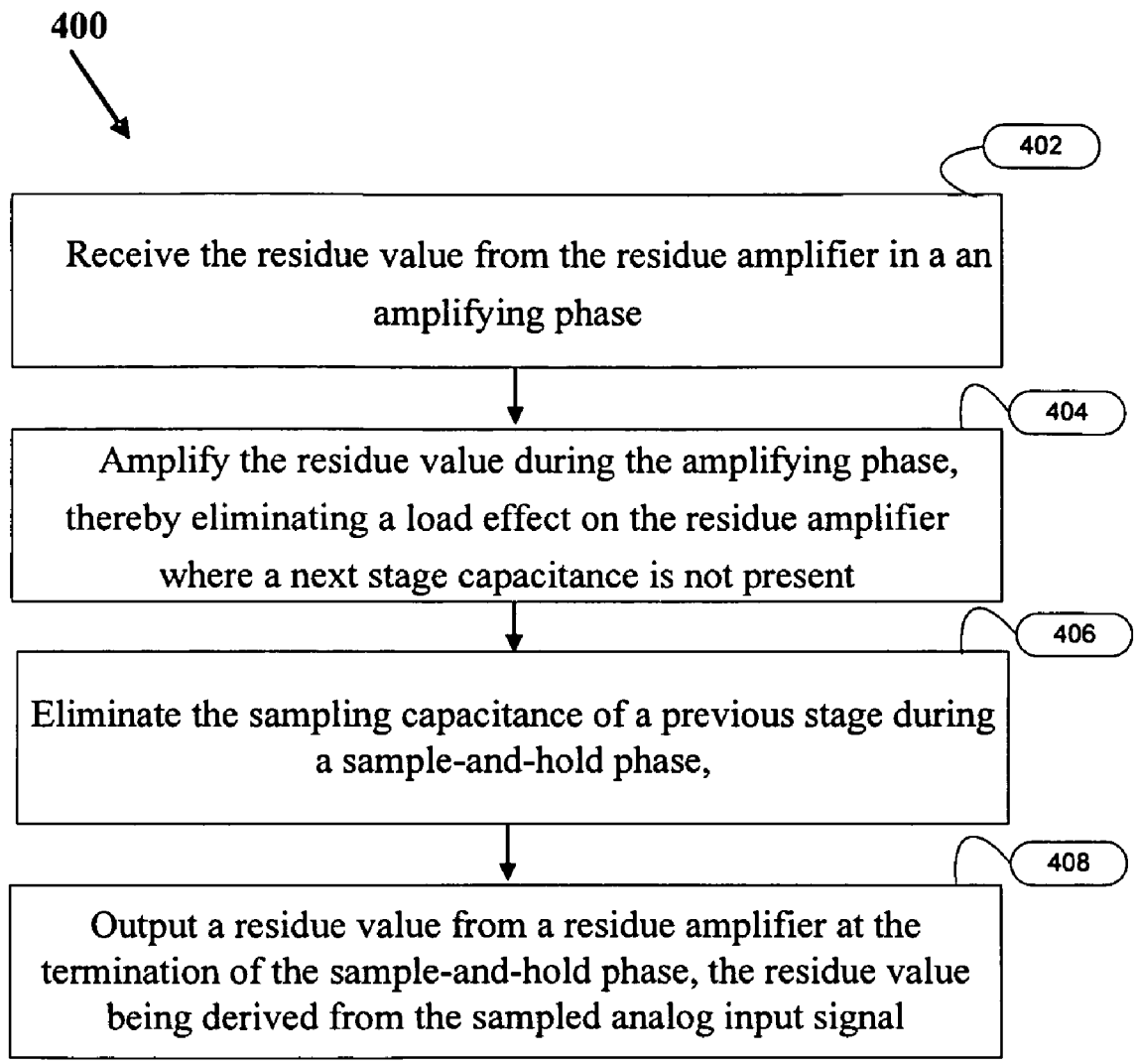
FIG: 4

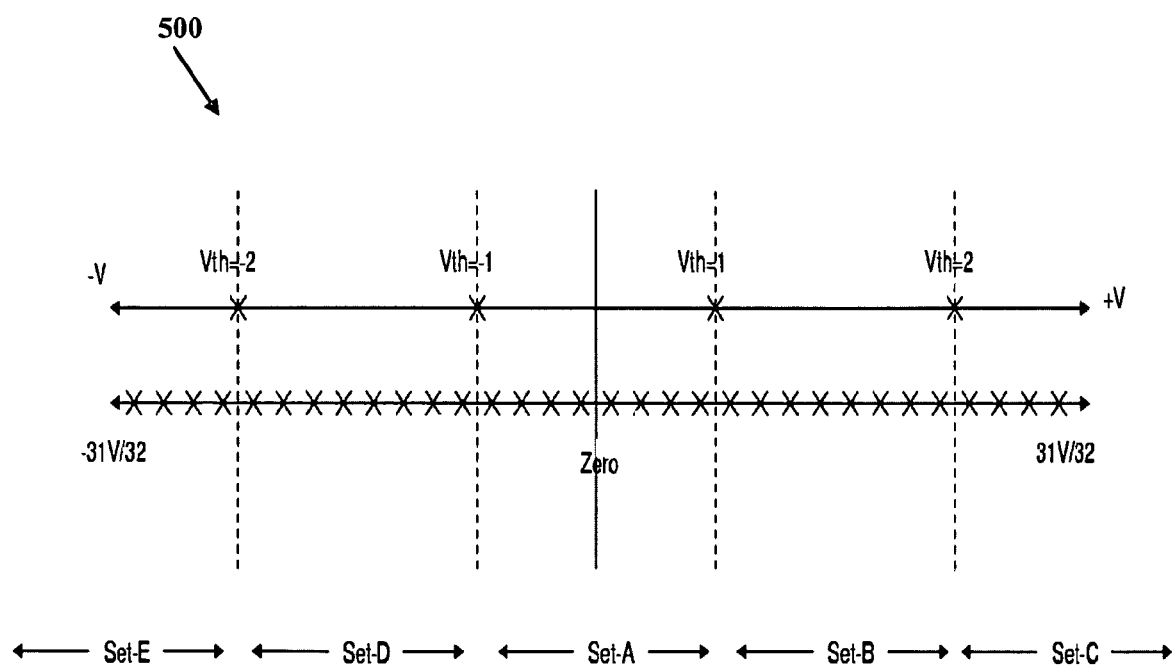
FIG: 5

SYSTEM AND METHOD FOR REDUCING POWER DISSIPATION IN AN ANALOG TO DIGITAL CONVERTER

CROSS-REFERENCE TO RELATED APPLICATIONS

This application claims priority to Indian Provisional Patent Application No. 1005/CHE/2006, filed Jun. 9, 2006, and Indian Non-Provisional Patent Application No. 1182/CHE/2007, filed Jun. 8, 2007, which are incorporated herein by reference.

BACKGROUND OF THE INVENTION

1. Technical Field

The present invention relates generally to analog to digital converters and more particularly to a system and method for reducing power dissipation in analog to digital converters.

2. Discussion of Prior Art

Analog to Digital (A/D) converters serve to translate a given analog input signal (over a given range of potential signal values) into a corresponding digital signal. Some applications require the conversion accuracy to be very high while maintaining a high rate of conversion. For those applications requiring high conversion accuracy at a high conversion rate, more power is dissipated. This is problematic for applications, such as mobile applications, where power dissipation is of paramount importance. The increasing need for low power A/D conversion has fueled a trend towards ever-improving ADC power efficiency.

The prior art is replete with a host of different types of ADC architectures. They include, for example, flash architecture, pipelined architecture, successive approximation architecture and sigma delta architecture.

FIG. 1 illustrates a general block diagram 100 of a pipelined ADC of the prior art. This pipelined ADC divides an analog-to-digital conversion task into several consecutive stages, namely, a sample and hold stage 102, followed by one or more pipelined stages 104 106 and 108, and finally a flash stage 110.

The sample and hold stage 102 samples and holds the analog input signal. It is followed by a set of pipelined stages 104, 106, 108. Each pipelined stage produces a digital estimate of an analog held signal received at an input of the stage. More particularly, at each pipelined stage, a digital estimate of the analog held signal is performed, the digital estimate is then converted back to an analog waveform and is subtracted from the analog held signal received at the input of the stage. The result of the subtraction is referred to as residue. The residual analog signal is then amplified in the hold phase and supplied to the next stage in the pipeline 104, 106, 108 to be sampled and converted in an identical manner.

The last stage is a flash stage 110 that determines the Least Significant Bits (LSB). The successive digital results from the respective pipelined stages are appropriately delayed throughout a bit alignment network. Finally, a digital correction stage 112 helps to recover the errors due to the comparators offset.

Each of the pipelined stages 104, 106, 108, as shown in FIG. 1, is constructed in an identical manner. That is, each includes a sample and hold circuit 114, an ADC 116 (e.g. a flash converter), and a Digital to Analog (D/A) converter (DAC) 118. The ADC uses two clock phases, namely, a sample phase and a hold phase for A/D conversion. The sample phase is used to sample the input signal on the sampling caps (not shown). The input analog signal is the output voltage from the previous stage. For the hold phase, the input signal is the analog voltage which is supplied as an input to the ADC. The hold phase is used to calculate the residue. The sampled input analog signal is subtracted from the nearest DAC value determined by the comparator array. The subtracted output is commonly referred to as residue. These two phases are described in greater detail as follows.

Referring now to the sample phase of the sample and hold stage 102, the sample and hold circuit 114 acquires and samples the analog input signal. The ADC 116 then converts the sampled signal to digital data. The conversion result forms the Most Significant Bits (MSB) of the digital output. This same digital output is fed into the DAC 118, and its output is subtracted from the original sampled signal, the subtracted output is commonly referred to as residue. The residual analog signal is then amplified in the hold phase and supplied to the next stage in the pipeline to be sampled and converted in an identical manner to stage 1, 104. This process is repeated through as many stages as are necessary to achieve a desired resolution.

In conventional pipelined ADCs, the large load on the residue amplifier and small feedback factor in the ADC stages contribute to undesirable power consumption in ADCs. In conventional pipeline architectures as illustrated in FIG. 1, when any stage is in hold phase, the very next stage is in sample phase, or, when a stage is holding the residue value the very next stage is sampling the same residue value. Consequently, the $1^{st}$, $3^{rd}$, $5^{th}$ etc. stages sample simultaneously and hold simultaneously; the $2^{nd}$, 4th, 6th etc. stages sample simultaneously and hold simultaneously. In accordance with the processes of sampling and holding, described above, both these factors namely, large load on the residue amplifier (load on the residue amplifier decides current) and small feedback factor in the circuit appears at the same time which in turn consumes a significant amount of power.

Hence, it would be advantageous to have a system and method for manipulating either of these two power consumption factors and thereby reduce the power dissipated in the ADC.

The present invention addresses these needs.

SUMMARY OF THE INVENTION

The present invention is a system and method for reducing power dissipation in an Analog to Digital Converter (ADC). A low power ADC architecture reduces the number of comparators used in a conventional ADC to achieve reduced power dissipation. The present invention also provides a method for reducing the bandwidth requirement on the main amplifier by using a pre-charge amplifier in an ADC.

According to one aspect of the invention, a low power analog to digital converter (ADC) is provided. The novel low power ADC includes a plurality of clock phases, and a plurality of switches coupled to a residue amplifier in each clock phase. Each of the plurality of clock phases includes two constituent phases, namely, a sample-and-hold phase followed by an amplifying phase. The amplifying phase in each clock phase includes a first set of switches coupled to the residue amplifier for amplifying the residue output of a sample-and-hold phase of a preceding clock phase. The amplified residue output is stored in a feedback capacitor using a second set of switches. The second set of switches is operable to couple a feedback capacitor to the residue amplifier. The amplifying phase further includes a third set of switches operable to couple a next stage (i.e., next clock phase) sampling capacitor to the residue amplifier such that the next stage sampling capacitor samples an output of the residue amplifier.

According to another aspect of the invention, a method for reducing power dissipated in an analog to digital converter (ADC) is provided. The method includes the steps of: (a) receiving, in a current amplifying phase, a residue value output from a residue amplifier in a previous clock phase; (b) outputting a residue value from the residue amplifier at the termination of the sample-and-hold phase, the residue value being derived from the sampled analog input signal; (c) outputting the residue value from the residue amplifier to an amplifying phase; and (d) amplifying the residue value in the amplifying phase, thereby eliminating a load effect on the residue amplifier. The method further includes the steps of: driving a small load while holding a small feedback factor in the amplifying phase to eliminate an undesirable load effect during the amplifying phase; and driving a large load on the residue amplifier to increase a feedback factor in the sample-and-hold phase.

According to yet another aspect of the invention, a method for reducing power dissipated in an ADC is provided, wherein the ADC is comprised of a plurality of clock phases, each phase being identically comprised of an amplifying phase and a sample-and-hold phase. The method includes the steps of: for each of the plurality of clock phases: (a) calculating a residue value in the amplifying phase (b) holding the calculated residue value for the duration of the entire clock phase comprising the sample-and-hold phase and amplifying phase and (c) selecting a threshold value for a next set of comparators in an immediately preceding sample-and-hold phase clock phase based on the held residue value at the step (b). It is noted that the invention contemplates other means for dissipating power in the ADC, such as, by reducing the speed requirement on the comparator.

Other aspects and example embodiments are provided in the Figures and the Detailed Description that follows.

BRIEF DESCRIPTION OF THE DRAWINGS

FIG. 1 is an illustration of a simplified block diagram of a pipelined ADC, according to the prior art;

FIG. 2 is a circuit diagram illustrating the two clock phases of the ADC according to an embodiment of the invention;

FIG. 3 is a circuit diagram illustrating an example of implementation of the ADC according to an embodiment of the invention;

FIG. 4 is a flow diagram illustrating the steps in the method for reducing power dissipated in an ADC according to an embodiment of the invention;

FIG. 5 explains how partitioning the comparators in two sets reduces the number of comparators used in ADC according to an embodiment of the invention; and

DETAILED DESCRIPTION

The present invention is a system and method for reducing power dissipation in an Analog to Digital Converter (ADC). Low power ADC architecture reduces the number of comparators used in a conventional ADC to achieve reduced power dissipation. The present invention also provides a method for reducing the bandwidth requirement on the main amplifier by using a pre-charge amplifier in an ADC.

FIG. 2 is a circuit diagram 200 illustrating the two clock phases of an ADC according to an embodiment of the invention. The two clock phases in the ADC comprise a sample-and-hold phase and an amplifying phase, described as follows.

Amplifying Phase

The amplifying phase 202 samples the input data to the ADC and calculates and amplifies a residue value which represents the difference between the input analog value and a sample of the analog value. The amplifying phase 202 amplifies the residue in a conventional manner, using a sampling capacitor (Cs) 208 and a feedback capacitor (Cf) 206 coupled to the residue amplifier 212 in feedback. It should be understood that the residue amplifier 212 is shared amongst the two phases and is therefore indicated by the same label 212 in each phase.

Sample-and-Hold Phase

The sample-and-hold phase 204, samples the residue output of the amplifying phase 202. In the sample-and-hold phase 204 the feed back capacitor (Cf) 206 is coupled to the residue amplifier 212 in a feedback loop and a next stage sampling capacitor (Csnext) 210 samples the output of the residue amplifier 212. By virtue of using the residue amplifier 212 in both phases of the clock, the load effect on the residue amplifier 212 is eliminated during the time the residue output is being amplified, and the effect of the low feedback factor is eliminated during the time the amplified output is sampled. Since the load on the residue amplifier 212 decides the current, power dissipation in the ADC is significantly reduced by virtue of using the residue amplifier 212 in both phases. According to this architecture of the invention, at each stage, sample/hold occurs exclusively in one phase and amplification occurs exclusively in the other phase.

FIG. 3 is a circuit diagram 300 illustrating an illustrative exemplary embodiment of an ADC based on the circuit architecture of FIG. 2. In conformance with FIG. 2, the circuit diagram 300 illustrates the operations of a typical clock phase of the ADC comprised of two phases, i.e., a sample-and-hold phase 204 and an amplifying phase 202.

The operation of the circuit diagram 300 illustrating an exemplary embodiment of an ADC based on the circuit architecture of FIG. 2, is described as follows.

Referring now to FIG. 3, during the amplifying phase 202, the switches labeled S1 302 and S2, 304 are closed connecting the sampling capacitor Cs 208 to the residue amplifier 212. A feedback capacitor Cf 206 is connected to the residue amplifier 212 in feedback using switches labeled S3 306 and S4 308. The connection of any of the switches labeled S1 is made such that the input terminals are connected to any of—reference plus (REFP), reference minus (REFM) or reference common mode (REFCM) as determined from the output of the flash ADC 318.

During the amplifying phase 202, the residue output of a previous sample-and-hold phase 204 is amplified in the residue amplifier 212 and stored in the feedback capacitor Cf 206.

During the previous sample-and-hold phase 204, the switches labeled S3, S4 306, 308 are in a closed state connecting the feedback capacitor Cf 206 around the residue amplifier 212 in feedback. Also, the switches labeled S5 310 and S6 312, are shown in a closed state connecting a next stage sampling capacitor Csnext 210 to the output of the residue amplifier 212.

During the previous sample-and-hold phase 204, the next stage sampling capacitor Csnext 210 samples the residue value stored in the feedback capacitor Cf 206 from the previous amplifying phase 202. Periodic reset of the charge on the feedback capacitor Cf 206 can be achieved by allocating a fraction of the time-period for resetting the feedback capacitor. It can also be achieved by using two feedback capacitors and alternating them for amplifying phase 202 and sample-and-hold phase 204.

It should be appreciated that the particular exemplary embodiment of FIG. 3 is provided by way of illustration, and not limitation. Those knowledgeable in the art will recognize that other circuit configurations may be used for sharing the load on the residue amplifier 212 between the clock phases.

FIG. 4 is a flow diagram illustrating a process 400 for reducing power dissipation in an ADC, according to an embodiment of the invention.

At step 402, an amplified residue output is received at an ADC amplifying phase from an immediately preceding sample-and-hold clock phase of the ADC.

At step 404, a load effect on a residue amplifier, which is shared between adjacent clock phases, is eliminated by amplifying the residue output of the amplifying phase to generate an amplified residue output in the amplifying phase. The load effect is eliminated by driving a small load while maintaining a small feedback factor in the amplifying phase.

At step 406, the effect of low feedback factor is eliminated in the ADC by eliminating a sampling capacitance when sampling the amplified residue output in the sample-and-hold phase. The undesirable effect of a low feedback factor is eliminated by driving a large load on the residue amplifier and increasing a feedback factor in the sample-and-hold phase. In other words, the load on the residue amplifier is shared between the sample-and-hold phase and the amplifying phase by avoiding a slowing-effect of the low feedback factor while the next stage capacitance is sampling in the sample-and-hold phase and a loading effect of the next stage sampling capacitor is avoided while amplifying the residue value in the amplifying phase.

At step 408, the residue value from the residue amplifier is output at the termination of the sample-and-hold phase. The residue value is derived from the sampled analog input signal.

It should be appreciated that a power advantage is achieved in the ADC by sharing the load on the residue amplifier across the two phases (amplifying and sample and hold) of each clock phase. By sharing the load across each phase, it is never fully present in either phase. As is well known in the art, the load determines the required current, and if the load is reduced, in accordance with invention principles, it therefore follows that the power dissipation will be similarly reduced.

FIG. 5 is a diagram for describing how partitioning the comparators into two sets reduce the overall number of comparators used in an ADC, according to an embodiment of the invention 500. For the sample-and-hold phase, at each stage, input data is sampled whereby the input data is a residue output of the previous stage, with the exception of stage 1. For stage 1, the input data to the ADC is sampled and the amplifying phase is used to calculate the residue. It is noted that the residue value for each stage is held for two consecutive clock phases, namely, a current amplifying phase and the next sampling-and-hold phase. This is in contrast with conventional ADCs, in which the residue output of any stage is available to the next stage comparators as well as to the sampling capacitors for only one clock phase, namely the hold phase. In a conventional ADC, the comparator takes decision in the hold phase and this decision is used in the next phase (which is the sample phase of the current stage and the hold phase of the next stage) to calculate residue.

In contrast to a conventional ADC, in the present invention the residue value of any stage is available for two clock phases, an amplifying phase (e.g., phase A) followed by the next sampling phase (e.g., phase B). The sampling capacitors in the next sampling phase (e.g., phase B) are available for sampling only in that phase. However, another array of comparators is used to make a crude determination of the residue value in the first phase, e.g., phase A. Based on this decision process in phase A, the comparator thresholds may be appropriately selected in phase B. The comparator outputs are used in the following amplifying phase to calculate the residue the stage.

To more clearly illustrate this concept, a stage extracting 5-bits is taken as an example. It should be appreciated that while FIG. 5 illustrates a stage extracting 5 bits by way of example and not limitation. That is, the same concept can be generalized for a stage extracting any number of bits greater than 1 bit. In a conventional ADC architecture, 32 comparators are needed to predict the closest Digital to Analog Conversion (DAC) value. Assuming each comparator take 100 uA and offers 50 fF load to the previous stage, the total current required for the comparator array is 3.2 mA and presents 1.6 pF load to the previous stage. Now, for the architecture of the present invention, 4 comparators are used in phase A to estimate the residue to an accuracy of 2 bits. Depending on the comparator decision, the next set of 8 comparators is introduced in phase-B within the range specified by the $1^{st}$ set of comparators.

With continued reference to FIG. 5, a two step comparator implementation is illustrated, by way of example. The first sets of four comparators have respective threshold values at Vth=−2, Vth=−1, Vth=+1 and at Vth=+2. The second sets of comparators have variable threshold values and can be chosen from any set from among Set-A through Set-E. Depending on the decision of the first set of comparators, one of the sets among set A, set B, set C, set D, set E is chosen for the threshold values for the next set of comparators. For example, if the first set of comparators predicts that the residue value lies within Vth1 and Vth−2, the second set of 8 comparators are placed at the threshold values in set-B. On the other hand, if the first set of 4 comparators predict that the residue is within Vth=−1 and Vth=+1, the threshold value of the next 8 set of comparators are placed at that given by set-A.

It should be appreciated that FIG. 5 is only an exemplary implementation and, in some implementations, the threshold values of the first and second sets of comparators can be placed anywhere depending on the ease of implementation.

It is noted that the total number of comparators is advantageously reduced by 60%, with similar advantages for the power dissipation of the comparator and the load offered by the comparator.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A method for reducing power dissipated in an analog to digital converter (ADC) comprised of a plurality of clock phases, each clock phase comprising an amplifying phase and a sample-and-hold phase for respectively amplifying and sampling an analog input signal, comprising the steps of:

(a) receiving, in a current amplifying phase, a residue value output from a residue amplifier in a previous clock phase; and
(b) amplifying said residue value during said current amplifying phase, thereby eliminating a load effect on said residue amplifier;
(c) driving a large load on the residue amplifier and increasing a feedback factor in the sample-and-hold phase and eliminating the sampling capacitance of a previous stage during a sample-and-hold phase, thereby eliminating a low feedback factor; and
(d) outputting the residue value from the residue amplifier at the termination of a sample-and-hold phase, the residue value being derived from said sampled analog input signal.

2. The method of claim 1, wherein power dissipated in said analog to digital converter (ADC) is reduced by sharing the large load on the residue amplifier between both said sample-and-hold phase and said amplifying phase.

3. A method for reducing power dissipated in an analog to digital converter (ADC), the method comprising the step of:
holding a residue value of a phase for two consecutive phases for each of a plurality of clock phases, whereby value input to a comparator is available for two consecutive phases, wherein said holding step further comprises:
calculating said residue value in said amplifying phase using a first set of comparators, said amplifying phase for amplifying an output of a previous sample-and-hold phase; and
selecting a threshold value of a second set of comparators in a subsequent sample-and-hold phase based on the residue value calculated at said calculating step.

4. The method of claim 3, wherein the number of comparators used in said analog to digital converter is reduced by sharing the residue value between two consecutive phases from among the plurality of clock phases whereby power dissipated is reduced.

5. The method of claim 3, wherein the holding step further comprises:
reducing the speed requirement on the comparator whereby reducing power dissipated.

6. The method of claim 3, wherein the sample-and-hold phase and the amplifying phase in each of said plurality of clock phases occur in a sequentially continuous manner.

* * * * *